(12) United States Patent
Maskovyak et al.

(10) Patent No.: US 6,555,935 B1
(45) Date of Patent: *Apr. 29, 2003

(54) APPARATUS AND METHOD FOR FAST FET SWITCHING IN A DIGITAL OUTPUT DEVICE

(75) Inventors: George D. Maskovyak, Parma, OH (US); Nedyalko V. Ivanov, Strongsville, OH (US)

(73) Assignee: Rockwell Automation Technologies, Inc., Mayfield Heights, OH (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/573,750

(22) Filed: May 18, 2000

(51) Int. Cl.[7] .............................................. G02B 27/00
(52) U.S. Cl. ...................................... 307/125; 307/117
(58) Field of Search ................................ 307/117, 125; 250/551; 327/374, 376, 377, 514

(56) References Cited

U.S. PATENT DOCUMENTS

| | | | | |
|---|---|---|---|---|
| 3,895,241 A | * | 7/1975 | Cooper ..................... | 250/208.4 |
| 4,303,831 A | * | 12/1981 | El Hamamsy .............. | 250/551 |
| 4,307,298 A | * | 12/1981 | El Hamamsy et al. ...... | 250/551 |
| 4,423,341 A | * | 12/1983 | Shelly ........................ | 307/570 |
| 4,564,770 A | * | 1/1986 | Sherman et al. ............ | 250/551 |
| 4,611,123 A | * | 9/1986 | McDonald ................... | 250/551 |
| 4,647,794 A | * | 3/1987 | Guajardo .................... | 250/551 |
| 4,665,316 A | * | 5/1987 | Hodges ....................... | 250/551 |
| 4,801,821 A | * | 1/1989 | Prevost et al. .............. | 250/551 |
| 4,801,822 A | * | 1/1989 | Idaka et al. ................. | 250/551 |
| 4,804,866 A | * | 2/1989 | Akiyama .................... | 250/551 |
| 4,902,901 A | * | 2/1990 | Pernyeszi ................... | 250/551 |
| 4,912,335 A | * | 3/1990 | Ehalt et al. ................. | 250/551 |
| 4,931,656 A | * | 6/1990 | Ehalt et al. ................. | 136/293 |
| 4,939,375 A | * | 7/1990 | Walters et al. .............. | 250/551 |
| 5,057,694 A | * | 10/1991 | Idaka et al. ................. | 136/293 |
| 5,136,138 A | | 8/1992 | Gilliland | |
| 5,151,602 A | * | 9/1992 | Idaka et al. ................. | 136/293 |
| 5,173,848 A | * | 12/1992 | Roof .......................... | 363/56 |
| 5,278,422 A | * | 1/1994 | Kato et al. .................. | 250/551 |
| 5,293,505 A | * | 3/1994 | Ogawa ....................... | 250/551 |
| 5,315,533 A | | 5/1994 | Stich et al. | |
| 5,360,979 A | * | 11/1994 | Joseph et al. ............... | 250/551 |
| 5,418,381 A | * | 5/1995 | Aizawa ...................... | 250/551 |
| 5,448,442 A | | 9/1995 | Farag | |
| 5,559,466 A | * | 9/1996 | Okumura et al. ..... | 250/214 SW |
| 5,612,582 A | * | 3/1997 | Shichi et al. ............... | 307/130 |
| 5,661,623 A | | 8/1997 | McDonald et al. | |
| 5,693,952 A | * | 12/1997 | Cox ........................... | 250/551 |
| RE35,836 E | * | 7/1998 | Rodriguez .................. | 250/551 |
| 5,886,252 A | | 3/1999 | Lennert et al. | |
| 5,959,493 A | * | 9/1999 | Cassista ..................... | 327/391 |

* cited by examiner

*Primary Examiner*—Fritz Fleming
(74) *Attorney, Agent, or Firm*—Himanshu S. Amin; Alexander M. Gerasimow; William R. Walbrun

(57) ABSTRACT

An industrial control output device is provided which provides electrical isolation between device power and field power. The device includes two isolation devices, one of which is adapted to energize a power switching device, and the other is adapted to de-energize the switching device. The output device thus minimizes or reduces EMI/RFI emissions and provides fast switching times in selectively providing power to a load. In addition, the invention includes a method of providing power to a load in an industrial control system, which allows fast switching of a digital output with minimal or reduced EMI/RFI emissions.

16 Claims, 13 Drawing Sheets

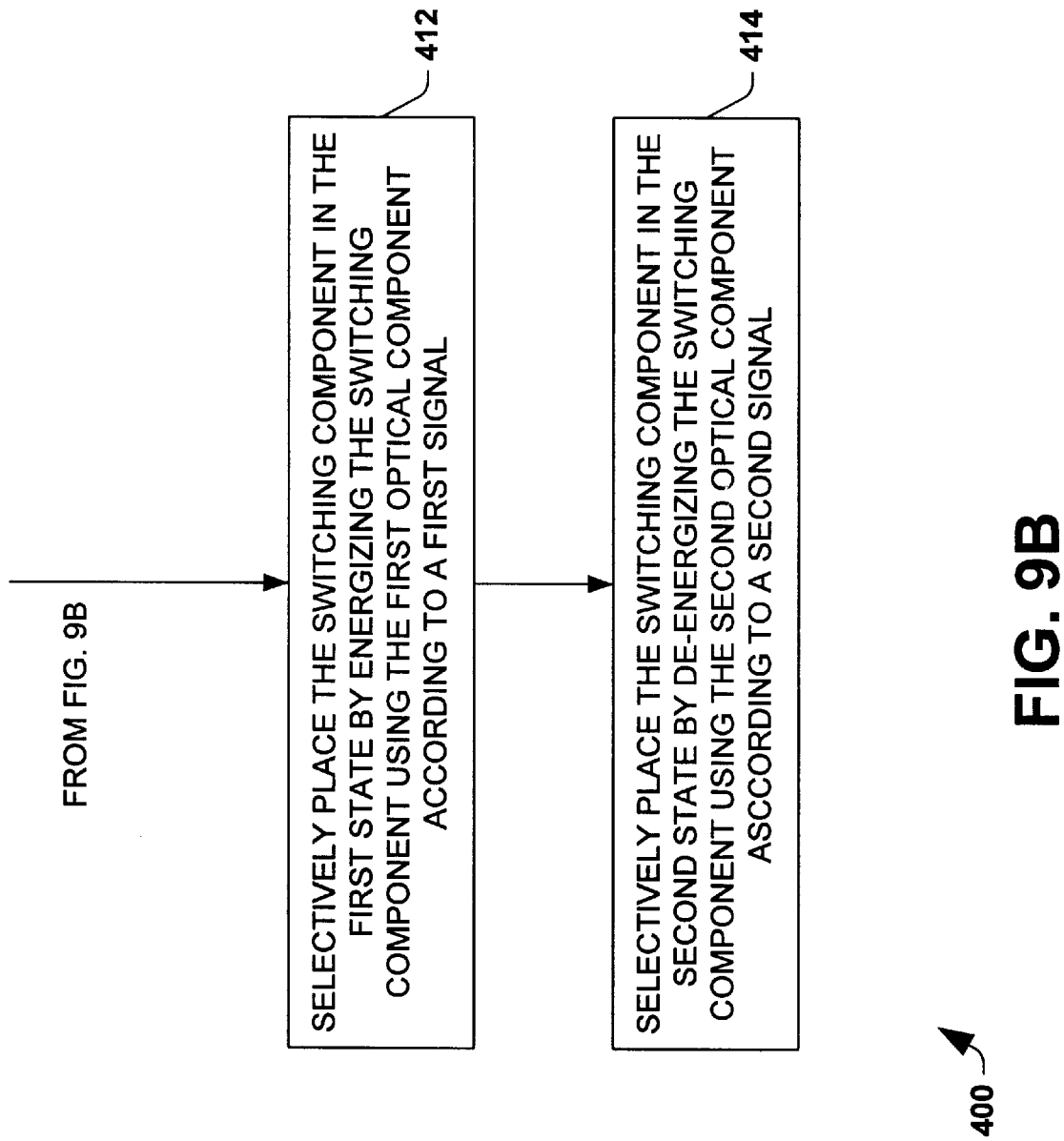

APPARATUS AND METHOD FOR FAST FET SWITCHING IN A DIGITAL OUTPUT DEVICE

TECHNICAL FIELD

The present invention relates to the art of industrial controllers, and more particularly to a method and apparatus for fast FET switching in an output device.

BACKGROUND OF THE INVENTION

Industrial controllers are special purpose computers used for controlling industrial processes, manufacturing equipment, and other factory automation. In accordance with a control program, the industrial controller measures one or more process variables or inputs reflecting the status of a controlled process, and changes outputs effecting control of the process. The inputs and outputs may be binary, (e.g., on or off), as well as analog inputs and outputs assuming a continuous range of values. The control program may be executed in a series of execution cycles with batch processing capabilities.

The measured inputs received from a controlled process and the outputs transmitted to the process generally pass through one or more input/output (I/O) modules. These I/O modules serve as an electrical interface between the controller and the controlled process, and may be located proximate or remote from the controller. The inputs and outputs are recorded in an I/O table in processor memory. Input values may be asynchronously read from the controlled process by one or more input modules and output values are written directly to the I/O table by the processor for subsequent communication to the process by specialized communications circuitry. An output module may interface directly with a controlled process, by providing an output from an I/O table to an actuator such as a valve, solenoid, and the like.

During execution of the control program, values of the inputs and outputs exchanged with the controlled process pass through the I/O table. The values of inputs in the I/O table are asynchronously updated from the controlled process by dedicated scanning circuitry. This scanning circuitry may communicate with input modules over a bus on a backplane or network communications. The scanning circuitry also asynchronously writes values of the outputs in the I/O table to the controlled process. The output values from the I/O table are then communicated to one or more output modules for interfacing with the process. Thus, the processor may simply access the I/O table rather than needing to communicate directly with the controlled process.

An industrial controller may be customized to a particular process by writing control software that may be stored in the controller's memory and/or by changing the hardware configuration of the controller to match the control task. Controller hardware configuration is facilitated by separating the industrial controller into a number of control modules, each of which performing a different function. Particular control modules needed for the control task may then be connected together on a common backplane within a rack. The control modules may include processors, power supplies, network communication modules, and I/O modules exchanging input and output signals directly with the controlled process. Data may be exchanged between modules using a backplane communications bus, which may be serial or parallel. A typical hardware modification may involve adding additional I/O modules so as to be able to control additional equipment.

Various control modules of the industrial controller may be spatially distributed along a common communication link in several racks. Certain I/O modules may thus be located in close proximity to a portion of the control equipment, and away from the remainder of the controller. Data is communicated with these remote modules over a common communication link, or network, wherein all modules on the network communicate using a standard communications protocol.

In a typical distributed control system, one or more output modules are provided for interfacing with a process. The outputs derive their control or output values in the form of a message from a master or peer device over a network or a backplane. For example, an output module may receive an output value from a processor, such as a programmable logic controller (PLC), via a communications network or a backplane communications bus. The desired output value is generally sent to the output module in a message, such as an explicit message or an I/O message. The output module receiving such a message will provide a corresponding output (analog or digital) to the controlled process.

Industrial process control systems and devices typically include one or more digital output circuits. Such digital outputs provide binary electrical signals used to interface with one or more components of a controlled process. A digital output may be used, for example, to switch electrical power (e.g., AC or DC) for such applications as energizing actuators, valves, motors, and the like. The switched power may be provided by the control device (e.g., a sourcing output) or externally by a user (e.g., a sinking output). Some digital outputs take the form of a relay contact (e.g., dry contact), which a user may employ to switch external power. Others may include one or more semiconductor switching devices, for example field effect transistors (FETs).

Electrical isolation is sometimes desirable in an output device. In order to achieve isolation of internal controller power from field power, some previous output devices have included an isolation transformer (e.g., a pulse transformer) in the digital output circuitry. However, the use of such a transformer may cause unacceptable electromagnetic interference (EMI) or radio frequency interference (RFI) emissions in an industrial control device. In the field of industrial controllers, reducing EMI and RFI emissions improves overall system safety where some devices in the system (or devices proximate the system) may be susceptible to such interference.

In addition to EMI considerations, the switching time of an output device may be important in certain control applications. In general, better process control is achievable by a controller where the switching time of output devices is reduced. Isolation transformers, such as are commonly used in digital output circuitry, have a finite switching time associated therewith. Thus, the use of an isolation transformer adds to the switching time of other devices in an output circuit (e.g., semiconductor switching devices) when a total device switching time is considered. In addition, isolation transformers increase the EMI/RFI emissions of such circuits during switching, due to the inductances of the transformer primary and secondary windings.

Other conventional industrial control digital output devices have included an optical coupling device (e.g., opto-coupler) to provide electrical isolation between control device power and field power. Although conventional optically coupled digital output devices have reduced the EMI/RFI emissions in industrial controls, switching methods and apparatus are desirable to provide further reduction in switching times, while providing low EMI/RFI emissions and electrical isolation, in order to improve control of industrial processes.

SUMMARY OF THE INVENTION

In accordance with the present invention, an industrial control output device is provided including electrical isolation between system power and field power, which minimizes or reduces EMI/RFI emissions therefrom and provides fast switching times (e.g., turn-on time and turn-off time) in selectively providing power to a load. The invention further contemplates a method of providing power to a load in an industrial control system which allows fast switching of a digital output with minimal or reduced EMI/RFI emissions.

According to one aspect of the present invention, there is provided an industrial control device comprising an output with a switching component adapted to selectively provide electrical power from a power source to a load, a first isolation component in electrical communication with the switching component and adapted to selectively energize the switching component, and a second isolation component in electrical communication with the switching component and adapted to selectively de-energize the switching component. According to another aspect, the control device may further comprise a logic component in electrical communication with the first and second isolation components and adapted to provide a signal thereto. The first isolation component may be adapted to selectively energize the switching component according to the signal and the second isolation component may be adapted to selectively de-energize the switching component according to the signal. In addition, the first and second isolation components are adapted to provide electrical isolation between the logic component and the power source, and may further comprise optical coupling devices.

According to another aspect of the invention, the isolation components may comprise opto-couplers, and the switching component may comprise a field-effect transistor (FET) having a gate in electrical connection with the first and second opto-couplers, a source in electrical connection with the power source, and a drain in electrical communication with the load. The first opto-coupler may accordingly be adapted to selectively provide a voltage between the gate and the source of the FET according to the signal, and the second opto-coupler may be adapted to selectively remove the voltage between the gate and the source of the FET according to the signal.

According to another aspect of the invention, the logic component may provide separate signals to the first and second isolation components. Thus, the industrial control device may further comprise a logic component in electrical communication with the first and second isolation components and adapted to provide a first signal to the first isolation component and a second signal to the second isolation component, wherein the first isolation component is adapted to selectively energize the switching component according to the first signal and the second isolation component is adapted to selectively de-energize the switching component according to the second signal. In this regard, the first isolation component may be adapted to selectively provide a voltage between the gate and the source of the FET according to the first signal, and the second isolation component may be adapted to selectively remove the voltage between the gate and the source of the FET according to the second signal.

According to yet another aspect of the present invention, there is provided an output device comprising a switching component adapted to selectively provide electrical power from a power source to a load, a first isolation component in electrical communication with the switching component and adapted to selectively energize the switching component, and a second isolation component in electrical communication with the switching component and adapted to selectively de-energize the switching component. Another aspect of the invention provides for the output device further comprising a logic component in electrical communication with the first and second isolation components and adapted to provide a signal thereto. The first isolation component may accordingly be adapted to selectively energize the switching component according to the signal and the second isolation component may be adapted to selectively de-energize the switching component according to the signal.

According to a further aspect of the invention, the output device comprises a logic component in electrical communication with the first and second isolation components and adapted to provide a first signal to the first isolation component and a second signal to the second isolation component. The first isolation component may be adapted to selectively energize the switching component according to the first signal and the second isolation component may be adapted to selectively de-energize the switching component according to the second signal. The switching component may comprise a FET having a gate in electrical communication with the first and second isolation components, a source in electrical communication with the power source, and a drain in electrical communication with the load, wherein the first isolation component may be adapted to selectively provide a voltage between the gate and the source of the FET according to the first signal, and the second isolation component may be adapted to selectively change the voltage between the gate and the source of the FET according to the second signal.

According to another aspect of the present invention, a method of providing power to a load in an industrial control system is provided. A switching component is provided in electrical communication with a power source and a load, and having a first state and a second state, and electrical power is provided from the power source to the load when the switching component is in the first state. The method further comprises discontinuing power from the power source to the load when the switching component is in the second state, providing a first optical component in electrical communication with the switching component and adapted to selectively energize the switching component, providing a second optical component in electrical communication with the switching component and adapted to selectively de-energize the switching component, selectively placing the switching component in the first state by energizing the switching component using the first optical component, and selectively placing the switching component in the second state by de-energizing the switching component using the second optical component.

According to yet another aspect of the invention, energizing the switching component using the first optical component in the method comprises providing a first signal to the first optical component, whereby the first optical component energizes the switching component, and wherein de-energizing the switching component using the second optical component comprises providing a second signal to the second optical component, whereby the second optical component de-energizes the switching component.

To the accomplishment of the foregoing and related ends, the invention, then, comprises the features hereinafter fully described. The following description and the annexed drawings set forth in detail certain illustrative aspects of the invention. However, these aspects are indicative of but a few of the various ways in which the principles of the invention may be employed. Other aspects, advantages and novel features of the invention will become apparent from the following detailed description of the invention when considered in conjunction with the drawings.

BRIEF DESCRIPTION OF THE DRAWINGS

FIG. 9B is a flow diagram further illustrating the method of FIG. 9A.

DETAILED DESCRIPTION OF THE INVENTION

Figure 1:
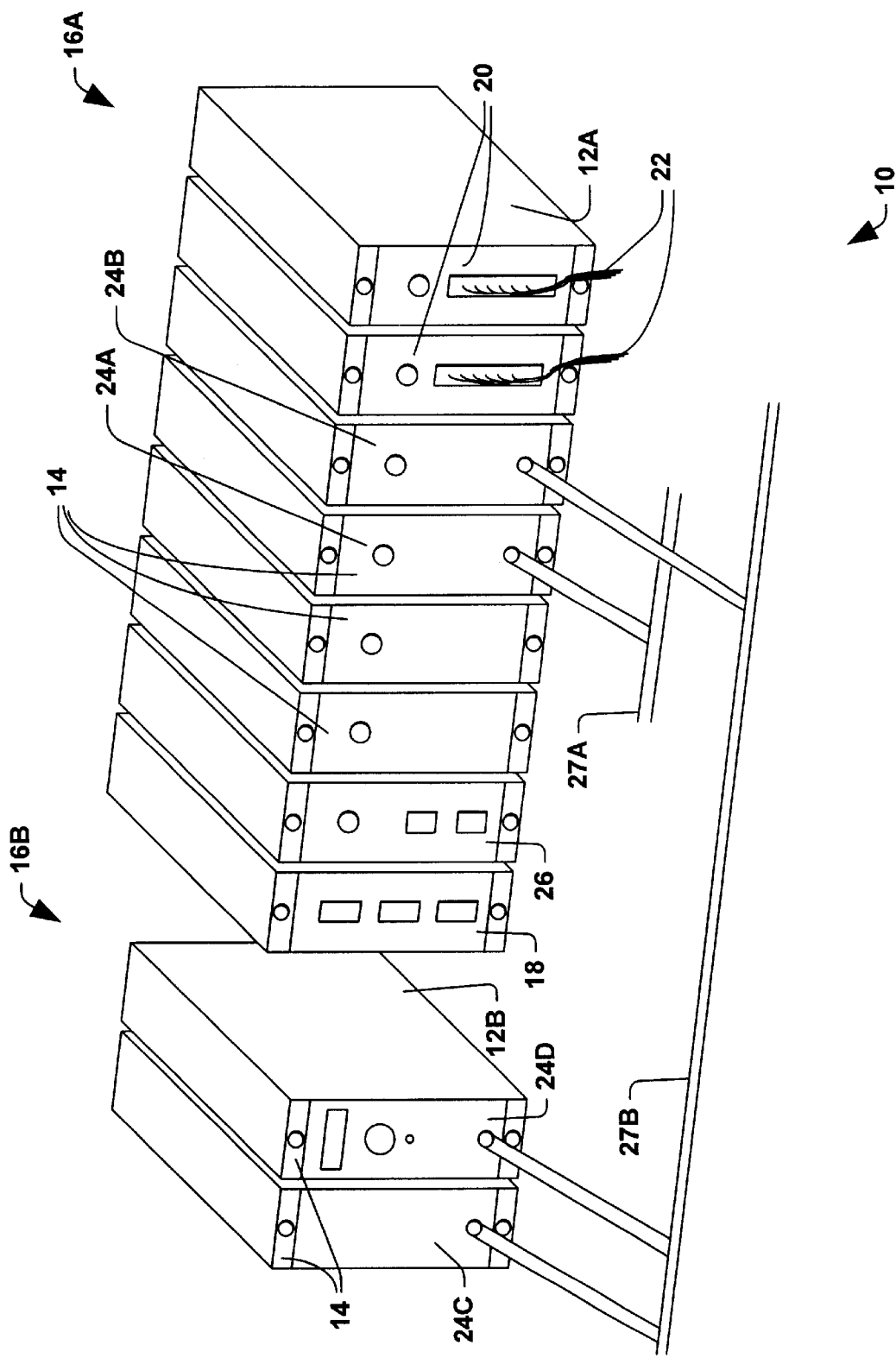
FIG. 1 is a perspective view illustrating an exemplary industrial controller having multiple functional modules contained in several racks joined by communication links.

The various aspects of the present invention will now be described with reference to the drawings, wherein like reference numerals are used to refer to like elements throughout. The invention provides an improved industrial control output device having reduced EMI/RFI emissions and faster switching times over the prior art.

Referring to FIG. 1, a distributed industrial control system 10 suitable for use with the present invention provides a first and second rack 12A and 12B for holding a number of functional modules 14 electrically interconnected by backplanes 16A and 16B running along the rear of the racks 12A and 12B respectively. Each module 14 may be individually removed from the rack 12A or 12B thereby disconnecting it from its respective backplane 16 as will be described below for repair or replacement and to allow custom configuration of the distributed system 10.

The modules 14 within the rack 12A may include, for example, a power supply module 18, a processor module 26, two communication modules 24A and 24B and two I/O modules 20. A power supply module 18 receives an external source of power (not shown) and provides regulated voltages to the other modules 14 by means of conductors on the backplane 16A.

The I/O modules 20 provide an interface between inputs from, and outputs to external equipment (not shown) via cabling 22 attached to the I/O modules 20 at terminals on their front panels. The I/O modules 20 convert input signals on the cables 22 into digital words for transmission on the backplane 16A. The I/O modules 20 also convert other digital words from the backplane 16A to the necessary signal levels for control of equipment.

The communication modules 24A and 24B provide a similar interface between the backplane 16A and one of two external high speed communication networks 27A and 27B. The high speed communication networks 27A and 27B may connect with other modules 14 or with remote racks of I/O modules 20 or the like. In the example illustrated in FIG. 1, the high speed communication network 27A connects with backplane 16A via the communication module 24A, whereas the high speed communication network 27B connects the communication module 24B with communication modules 24C and 24D in rack 12B.

The processor module 26 processes information provided by the communication modules 24A and 24B and the I/O modules 20 according to a stored program and provides output information to the communication module 24 and the I/O modules 20 in response to that stored program and received input messages.

Figure 2:
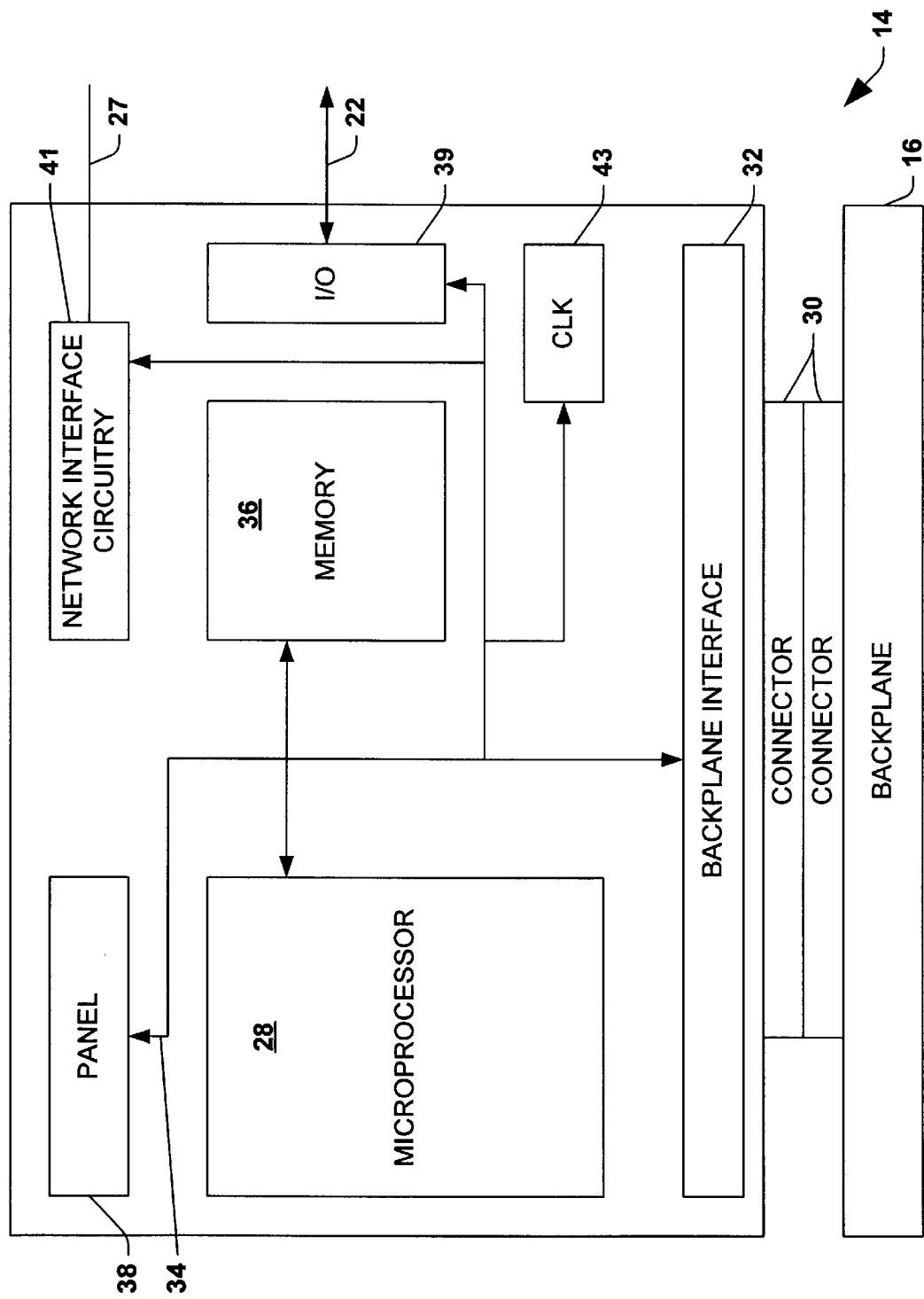
FIG. 2 is a schematic block diagram of a single functional module of FIG. 1 illustrating its connection to a common backplane and communication links to communicate with other modules.

Referring also to FIG. 2, each functional module 14, is attached to the backplane 16 by means of a separable electrical connector 30 that permits the removal of the module 14 from the backplane 16 so that it may be replaced or repaired without disturbing the other modules 14. The backplane 16 provides the module 14 with both power and a communication channel to the other modules 14.

Local communication with the other modules 14 through the backplane 16 is accomplished by means of a backplane interface 32 which electrically connects the backplane 16 through connector 30. The backplane interface 32 monitors messages on the backplane 16 to identify those messages intended for the particular module 14, based on a message address being part of the message and indicating the message's destination. Messages received by the backplane interface 32 are conveyed to an internal bus 34 in the module 14.

The internal bus 34 joins the backplane interface 32 with a memory 36, a microprocessor 28, front panel circuitry 38, I/O interface circuitry 39 (if the module is an I/O module 20) and communication network interface circuitry 41 (if the module is a communication module 24). The microprocessor 28 may be a general purpose microprocessor providing for the sequential execution of instructions contained in memory 36 and the reading and writing of data to and from the memory 36 and the other devices associated with the internal bus 34.

The microprocessor 28 includes an internal clock circuit (not shown) providing the timing of the microprocessor 28 but may also communicate with an external precision clock 43 of improved precision. This clock 43 may be a crystal controlled oscillator or other time standard including a radio link to an NBS time standard. The precision of the clock 43 is recorded in the memory 36 as a quality factor. The panel circuitry 38 includes status indication lights such as are well known in the art and manually operable switches such as for locking the module 14 in the off state.

The memory 36 holds programs executed by the microprocessor 28 to provide the functions as will be described and also variables and data necessary for the execution of those programs. For I/O modules 20, the memory 36 also includes an I/O table holding the current state of inputs and outputs received from and transmitted to the industrial controller 10 via the I/O modules 20.

Figure 3:
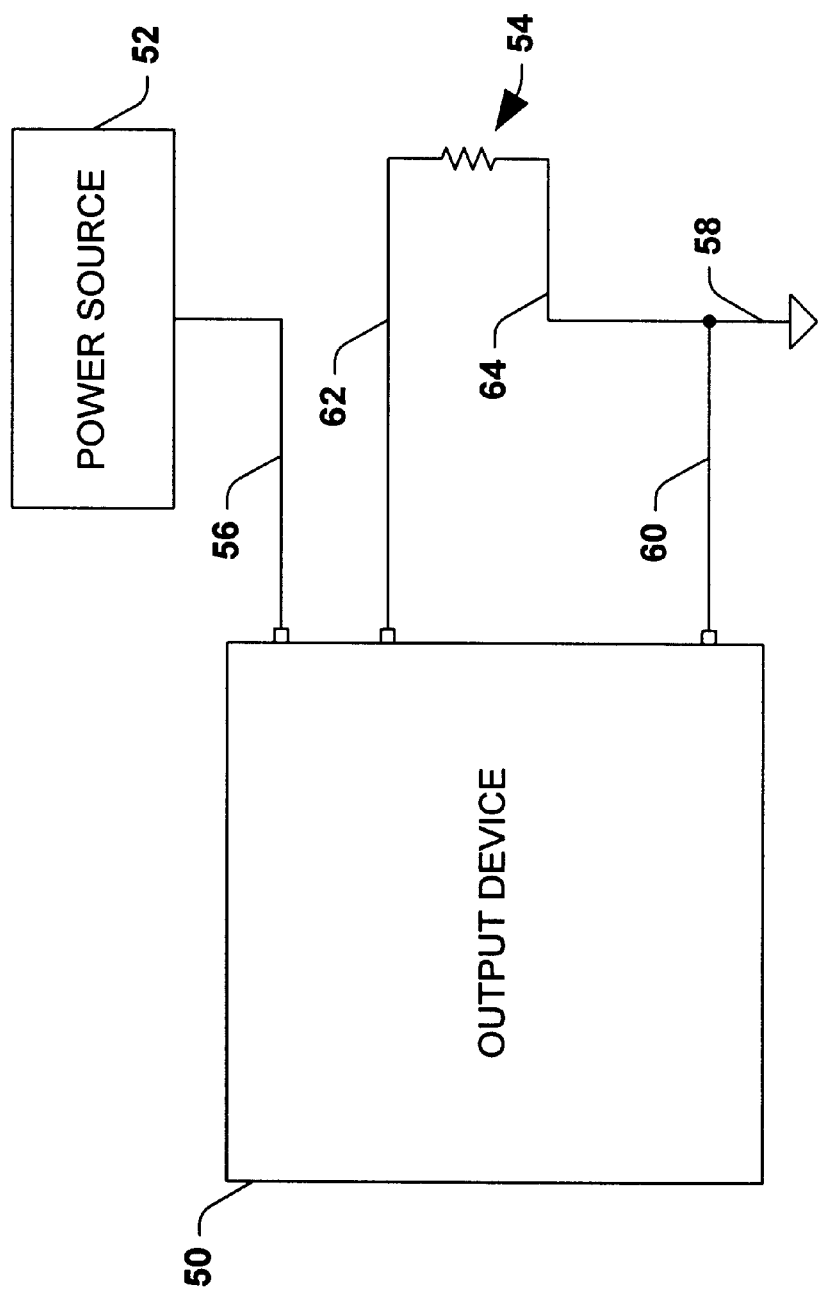
FIG. 3 is a block diagram illustrating an exemplary output device connected for selective provision of power from a power source to a load.

Referring now to FIG. 3, an exemplary output device 50 is connected for selective provision of electrical power from a power source 52 to a load 54. Power source 52 connects to the output device 50 via a cable 56, and further includes a ground or common 58 connected to device 50 via a cable 60. The load 54 is connected to the device 50 using cables 62 and 64. In the exemplary output device connection scheme of FIG. 3, the device 50 selectively provides power from the source 52 to the load 54 according to a control program (not shown) or a control signal from an external device (not shown) in order to provide control of one or more components of a controlled process, for example, motors, valves, actuators, and the like.

Figure 4A:
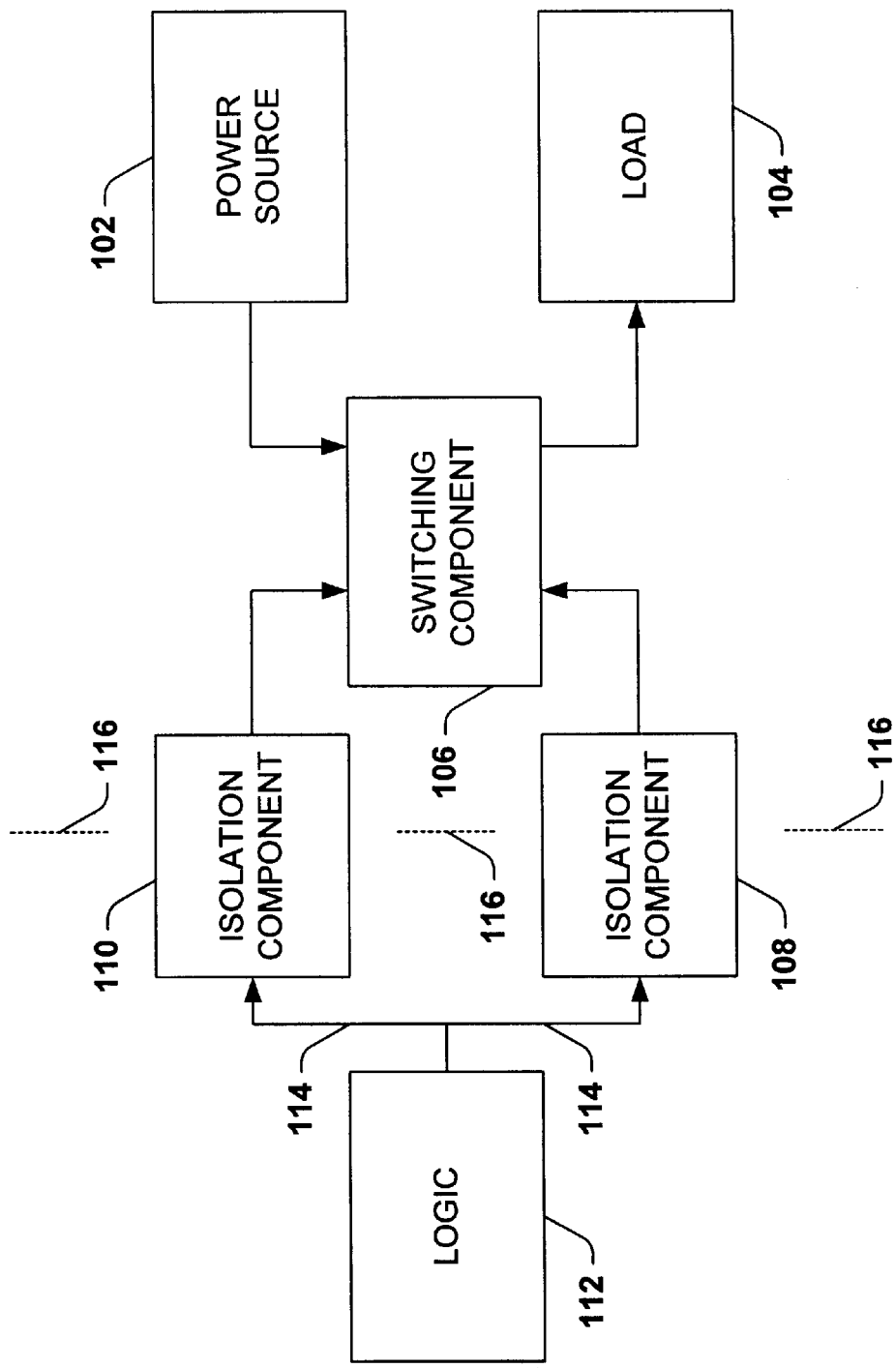
FIG. 4A is a block diagram illustrating an exemplary industrial control output device in accordance with the present invention, connected for selective provision of power from a power source to a load.

FIG. 4A illustrates an exemplary industrial control output device 100 in accordance with an aspect of the present invention, connected for selective provision of power from a power source 102 to a load 104. Power source 102 may include, for example, DC or AC electrical power. The device 100 comprises a switching component 106 with an electrical connection with the source 102 and the load 104, first and second isolation components 108 and 110 connected with the switching component 106, and a logic component 112 providing a signal 114 to the isolation components 108 and 110.

The switching component 106 may comprise, for example one or more semiconductor switching devices such as a field effect transistor (FET) with a gate with an electrical connection with optical components 108 and 110, a source with an electrical connection with power source 102, and a drain with an electrical connection with the load 104. The isolation components 108 and 110 may comprises, for example, opto-couplers, providing electrical isolation between the logic of device 100 and the power source 102 along an isolation barrier 116. According to one aspect of the invention, the first isolation component 108 may be adapted to selectively provide a voltage between the gate and the source of FET switching component 106 according to the signal 114, and the second isolation component 110 may be adapted to selectively remove the voltage between the gate and the source of the FET switching component 106 according to the signal 114. In this manner, the isolation components 108 and 110 may be adapted to selectively energize (e.g., turn on) and de-energize (e.g., turn off) the switching component 106, respectively.

Figure 4B:
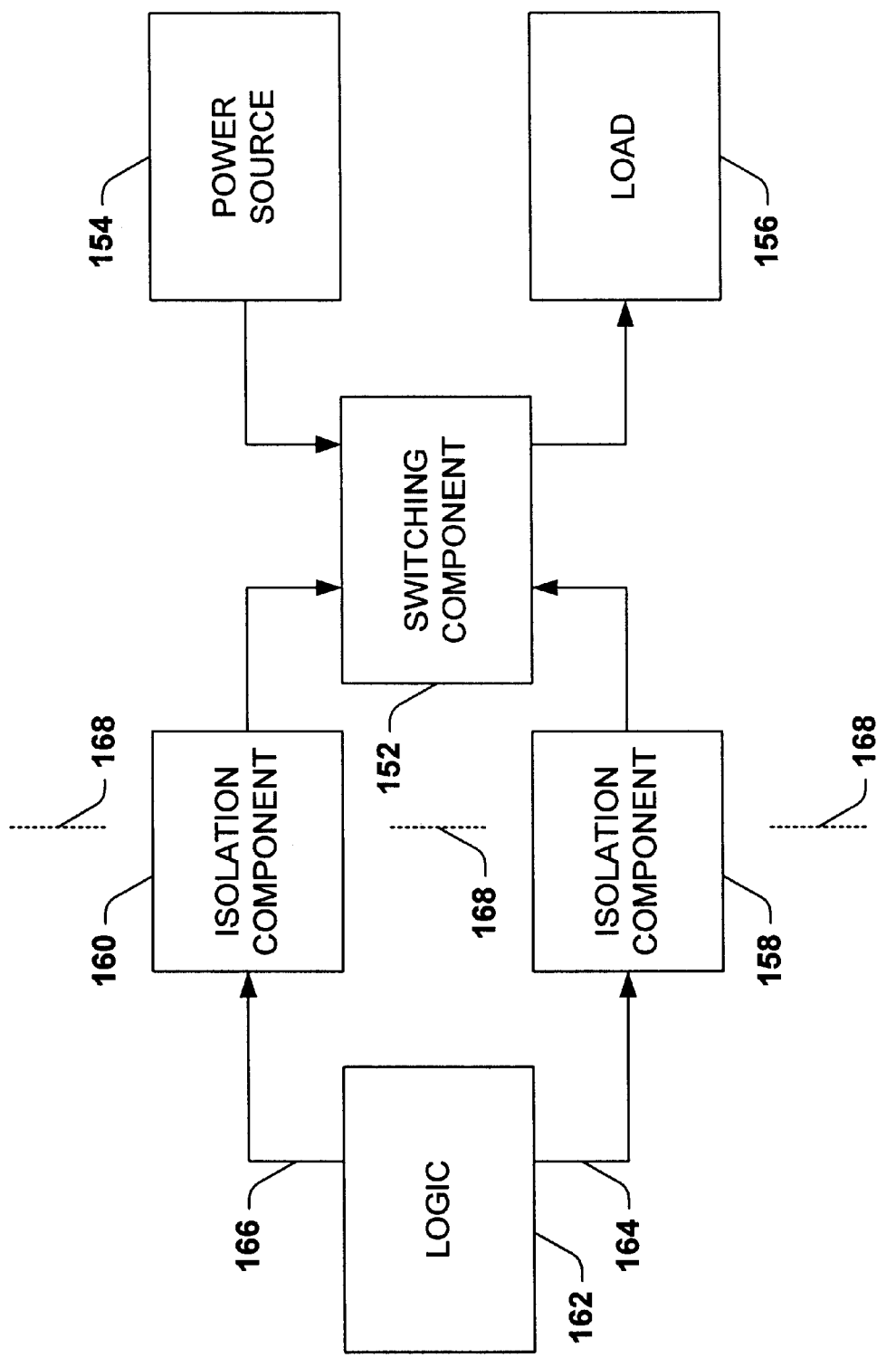
FIG. 4B is a block diagram illustrating another exemplary industrial control output device in accordance with the invention.

Referring also to FIG. 4B, another exemplary industrial control output device 150 is illustrated, with a switching component 152 adapted to selectively provide power from a power source 154 to a load 156 in accordance with another aspect of the invention. The device 150 comprises first and second isolation components 158 and 160 in electrical communication with the switching component 152 and a logic component 162. The isolation components 158 and 160 may be adapted to selectively energize and de-energize switching component 152 according to first and second signals 164 and 166 from logic component 162, respectively. In addition, the isolation components 158 and 160 provide an isolation barrier 168 between the power source 154 and the power (not shown) associated with the logic 162 of the device 150. According to another aspect of the invention, the first isolation component 158 may be adapted to selectively energize switching component 152 according to the first signal 164 from the logic component 162, and the second isolation component 160 may be adapted to selectively de-energize switching component 152 according to the second signal 166, whereby selective application of power from the power source 154 to load 156 is achieved, based on the signals 164 and 166.

Figure 5A:
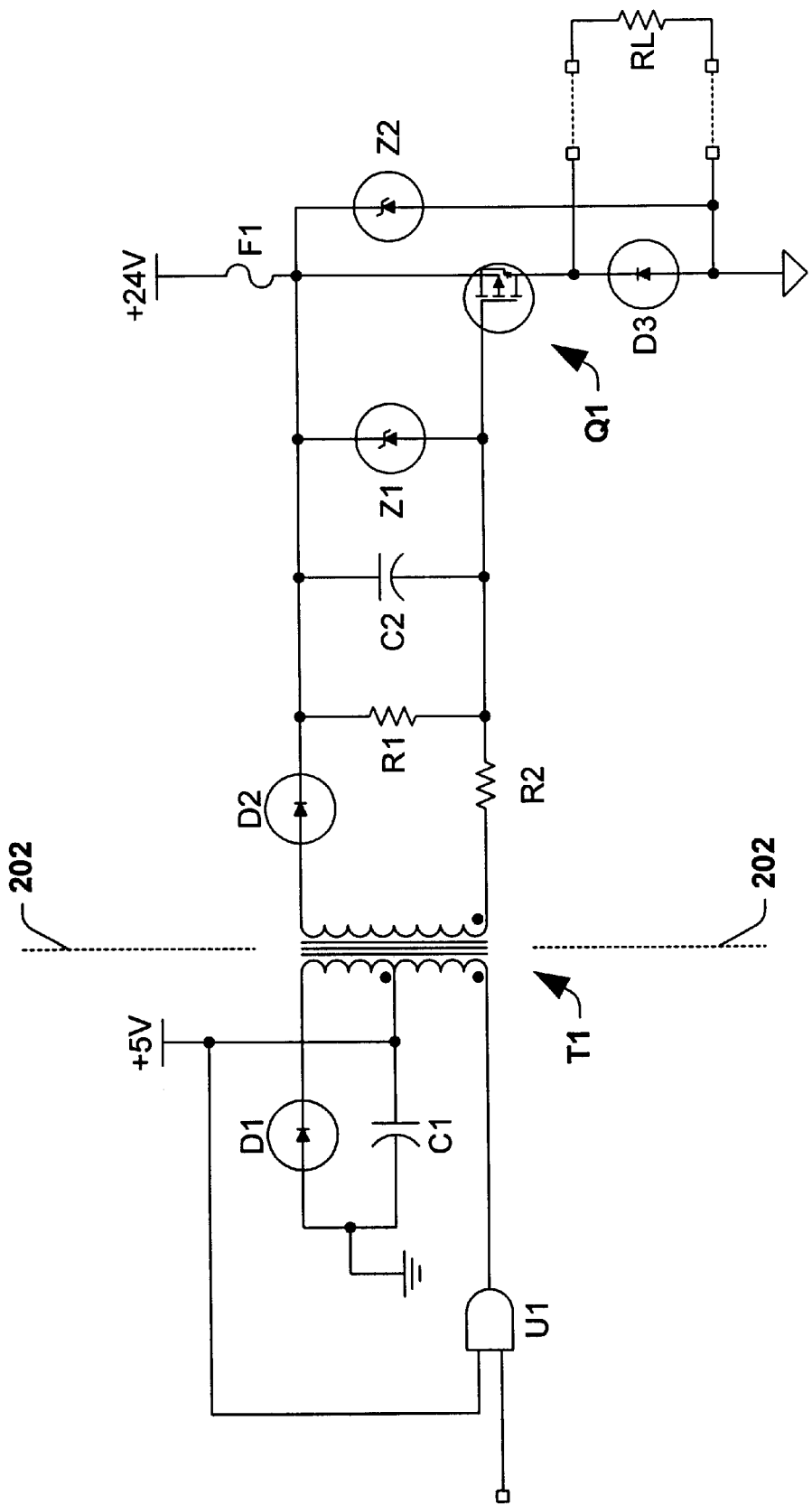
FIG. 5A is a schematic diagram illustrating a conventional output device having an isolation transformer.

Referring now to FIG. 5A, a conventional output device 200 is illustrated with a switching transistor Q1 adapted to switch power from a 24 volt DC power source +24V to a load RL according to a signal from a logic gate U1. The device 200 includes an isolation transformer T1 providing an isolation barrier 202 between the 5 volt DC logic power supply +5V associated with device 200, and the 24 volt DC source +24V supplying the load RL through transistor Q1. In operation, when the output of U1 is pulsed, the transformer T1 is energized, and the resistor network R1 and R2 provides a voltage divider between the source and gate of transistor Q1. This causes Q1 to conduct electrical current from the 24 volt source +24V to the load RL. When the output of gate U1 goes high, transformer T1 is de-energized, causing Q1 to eventually turn off, thereby discontinuing power transfer from source +24V to load RL. Although output device 200 of FIG. 5A achieves electrical isolation along barrier 202, the EMI/RFI emissions are high due to the leakage inductance (not shown) associated with the transformer T1, which emissions may be unacceptable in certain control applications. Moreover, the switching times associated with the device 200 are long (e.g., hundreds of microseconds) due to the use of transformer T1.

Figure 5B:
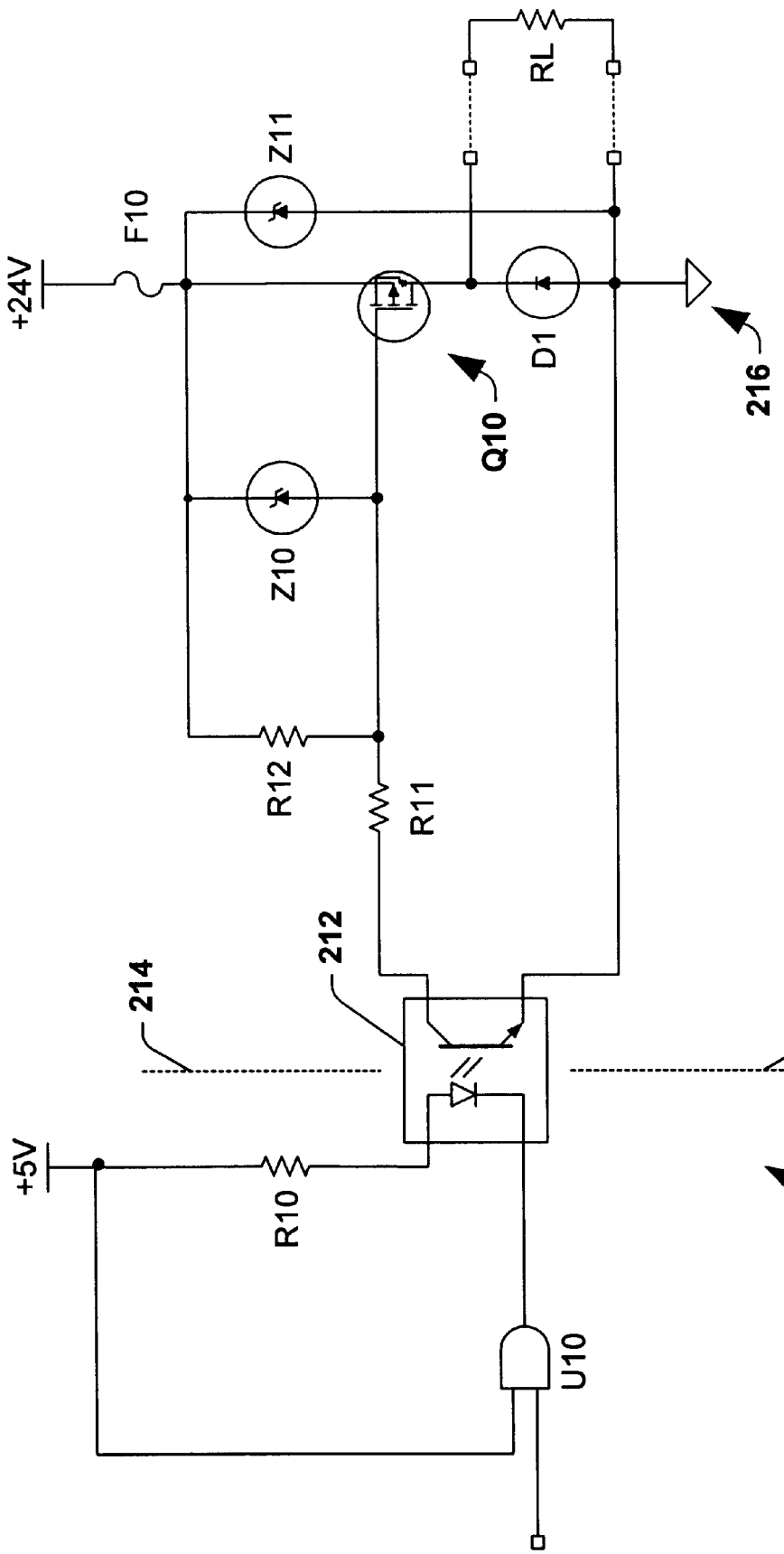
FIG. 5B is a schematic diagram illustrating another conventional output device having an opto-coupler.

Referring also to FIG. 5B, another conventional output device 210 is illustrated having an opto-coupler 212 establishing an electrical isolation barrier 214 between device logic power +5V and the 24 volt DC power source +24V supplying power to the load RL via a switching transistor Q10. When the output of a logic gate U10 goes low, the output transistor of the opto-coupler 212 conducts, causing current to flow from source +24V, through the voltage divider network R12 and R11, to a common or ground 216 associated with the power source +24V. This current flow, in turn, establishes a voltage between the source and gate of transistor Q10, which accordingly applies electrical power from the source +24V to the load RL. When the output of U10 goes high, the opto-coupler transistor turns off, causing the voltage across the source and gate of Q10 to decay according to the capacitance of Q10 and the resistance of R12, which eventually discontinues power to RL through transistor Q10. Since there is no transformer in the device 210, EMI/RFI emissions are therefore less than that of device 200 in FIG. 5A. However, the switching times (e.g., turn-on time and turn-off time) of device 210 remain high, due to the charging time and decay time associated with the resistive component R12 and the gate to source capacitance associated with transistor Q10. For example, the maximum off-to-on time for such an output device 210 may be 25 $\mu$S and the maximum on-to-off time may be 300 $\mu$S.

Figure 6:
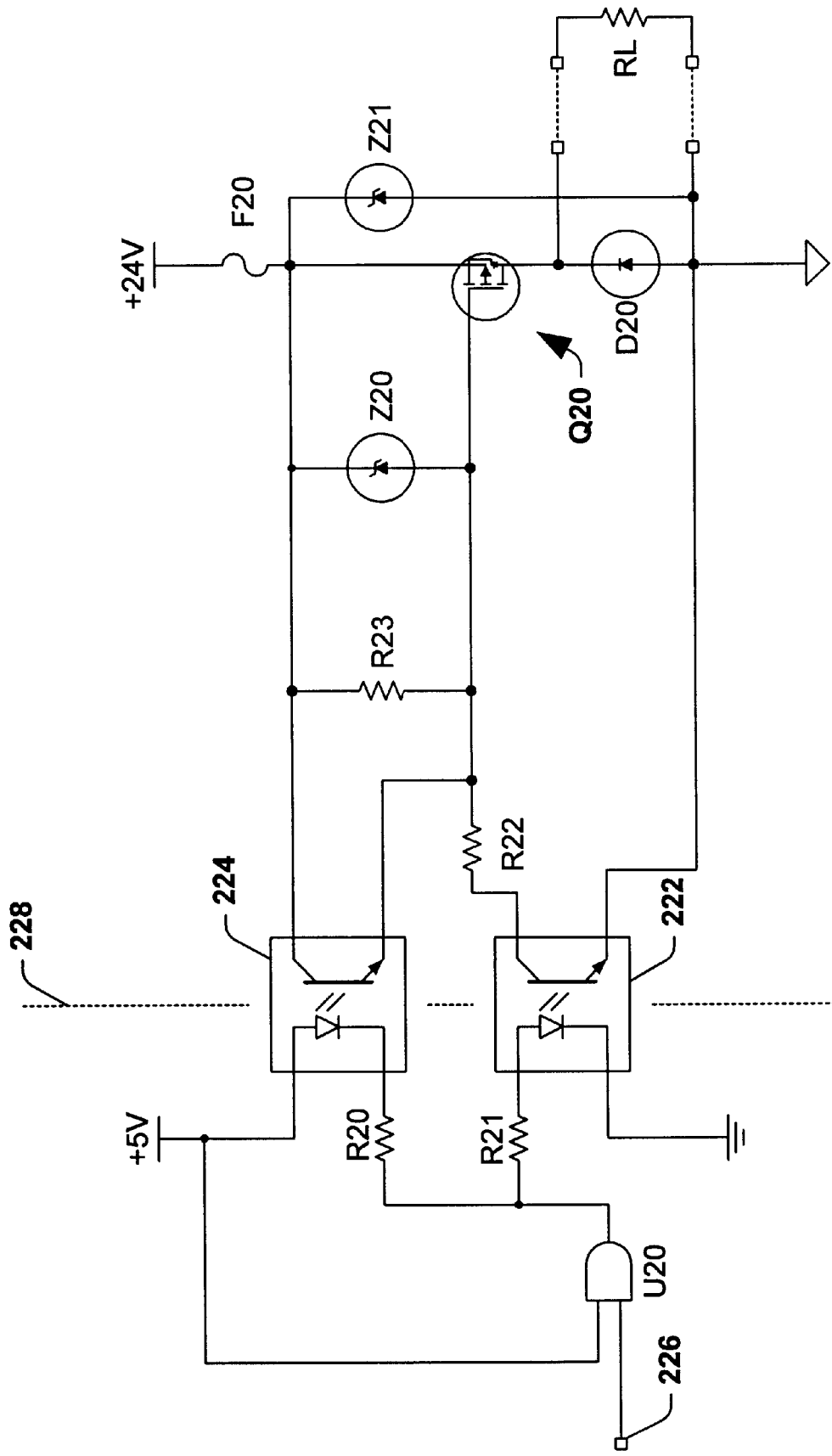
FIG. 6 is a schematic diagram illustrating an exemplary output device in accordance with an aspect of the present invention.

Referring now to FIG. 6, an exemplary output device 220 is illustrated in accordance with an aspect of the present invention, which includes a switching component Q20 (e.g., a FET) adapted to selectively provide electrical power from a power source +24V to a load RL. The device 220 further includes a first isolation component 222 (e.g., an opto-coupler) with electrical connection via resistor R22 with switching component Q20 and adapted to selectively energize Q20, as described in greater detail hereinafter. In addition, a second isolation component (e.g., opto-coupler) 224 is provided to selectively de-energize Q20. The second isolation component 224 thus provides active removal of the voltage across the gate and source of the switching component Q20.

The first and second isolation devices 222 and 224 are in electrical communication with a logic gate U20 via resistors R21 and R20, respectively, whereby U20 may provide a signal thereto in order to selectively energize and de-energize the switching component Q20 in a controlled fashion. In this regard, the logic component U20 may, for example, be provided with a signal (not shown) via terminal 226 from a control program or other logic function (not shown).

The isolation components 222 and 224 further provide an electrical isolation with the logic of device 220. Zener diodes Z20 and Z21 may provide overvoltage protection for switching device Q20 (e.g., 6.8 and 43 volt zeners, respectively), fuse F20 (e.g., 7 amp) provides current limiting for the device 220, and diode D20 provides clamping for inductive type loading (e.g., relay coils). The exemplary output device 220 may selectively provide the load RL with output voltages in the range of 10 to 31 or 32 VDC; however, it will be appreciated that other devices fall within the scope of the present invention in which other ranges are possible.

In operation, when the output of gate U20 goes high (e.g., 5 volts), the first isolation component 222 turns on, causing a current to flow through the resistive voltage divider network R22 and R23, whereby a voltage is established across the source and gate of Q20. This voltage in turn causes Q20 to conduct electrical current from the power source +24V to the load RL. During this time, the second isolation component 224 is off. When the output of U20 goes low (e.g., 0 volts), first isolation component 222 turns off and second isolation component 224 turns on (e.g., conducts). Isolation component 224 shorts the source and gate of switching component Q20, thus expediting the de-energization of switching component Q20. Thus, the turn-off time associated with device 220 is substantially improved over conventional devices such as devices 200 and 210 of FIGS. 5A and 5B, respectively, through the employment of the second isolation component 224 to actively remove voltage from the switching component Q20.

Figure 7:
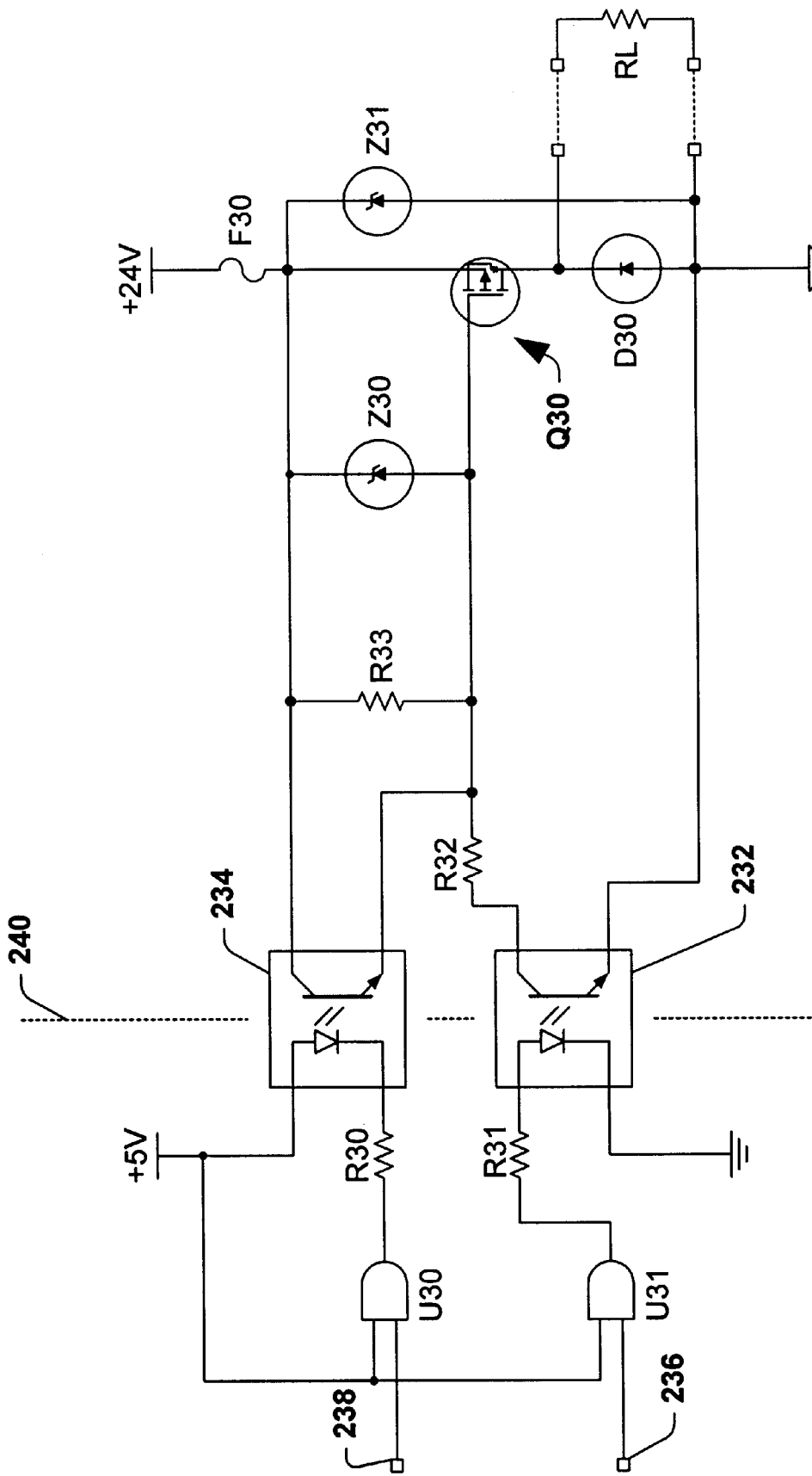
FIG. 7 is a schematic diagram illustrating another exemplary output device in accordance with another aspect of the present invention.

Referring also to FIG. 7, another exemplary output device 230 is illustrated in accordance with another aspect of the present invention. Device 230 includes a switching component Q30 (e.g., a FET) adapted to selectively provide electrical power from a power source +24V to a load RL. The device 230 further includes a first isolation component 232, which may be an opto-coupler, in electrical communication via resistor R32 with switching component Q30 and adapted to selectively energize Q30. A second isolation component (e.g., opto-coupler) 234 is provided to selectively turn off Q30. The first isolation device 232 may be in electrical communication with a logic gate U31 via resistor R31, whereby U31 may provide a first signal thereto in order to selectively energize the switching component Q30 in a controlled fashion. The logic gate U31 may, for example, be provided with a signal (as illustrated and described in greater detail hereinafter) via terminal 236 from a control program or other logic component (not shown), as described in greater detail hereinafter.

The second isolation component 234 may be in electrical communication with a logic gate U30 via a resistor R30 in order to receive a second signal therefrom, whereby the switching component Q30 may be selectively turned off. Logic component U30 may, for example, be provided with a signal via terminal 238 from a control program or other logic component (not shown). The isolation components 232 and 234 further provide an electrical isolation barrier 240 between the field power source +24V and the 5 volt source +5V associated with the logic of device 230.

In operation, when the output of gate U31 goes high (e.g., 5 volts), the first isolation component 232 turns on, causing a current to flow through the resistive voltage divider network R32 and R33, whereby a voltage is established across the source and gate of switching component Q30. This voltage causes Q30 to conduct electrical current from the power source +24V to the load RL. During this time, the second isolation component 234 is advantageously held in an off state via the signal at terminal 238 and gate U30. When the output of U31 goes low (e.g., 0 volts), first isolation component 232 turns off.

At this point, the second isolation component 234 may be turned on via gate U30 according to a signal on terminal 238. Isolation component 234 accordingly turns on, thereby actively removing the voltage between the source and gate of switching component Q30. As described in greater detail hereinafter with respect to FIGS. 8A and 8B, the second isolation component 234 may be controlled according to the second signal 316 at terminal 238, which may provide a low pulse of a certain duration for pulse-off operation of the component 234. The second isolation component 234 thereby de-energizes Q30 quickly, resulting in the ability to achieve faster off-to-on switching time for the device 230 than was heretofore possible. For example, the exemplary device 230 of FIG. 7 may achieve maximum off-to-on switching time of 25 $\mu$S and the devices 220 and 230 may achieve a maximum on-to-off switching time of 25$\mu$S, with a 1 ampere load. Typical on-to-off switching times on the order of 10 $\mu$S are thus possible with the invention, which is a significant improvement over conventional devices and methods.

Figure 8A:
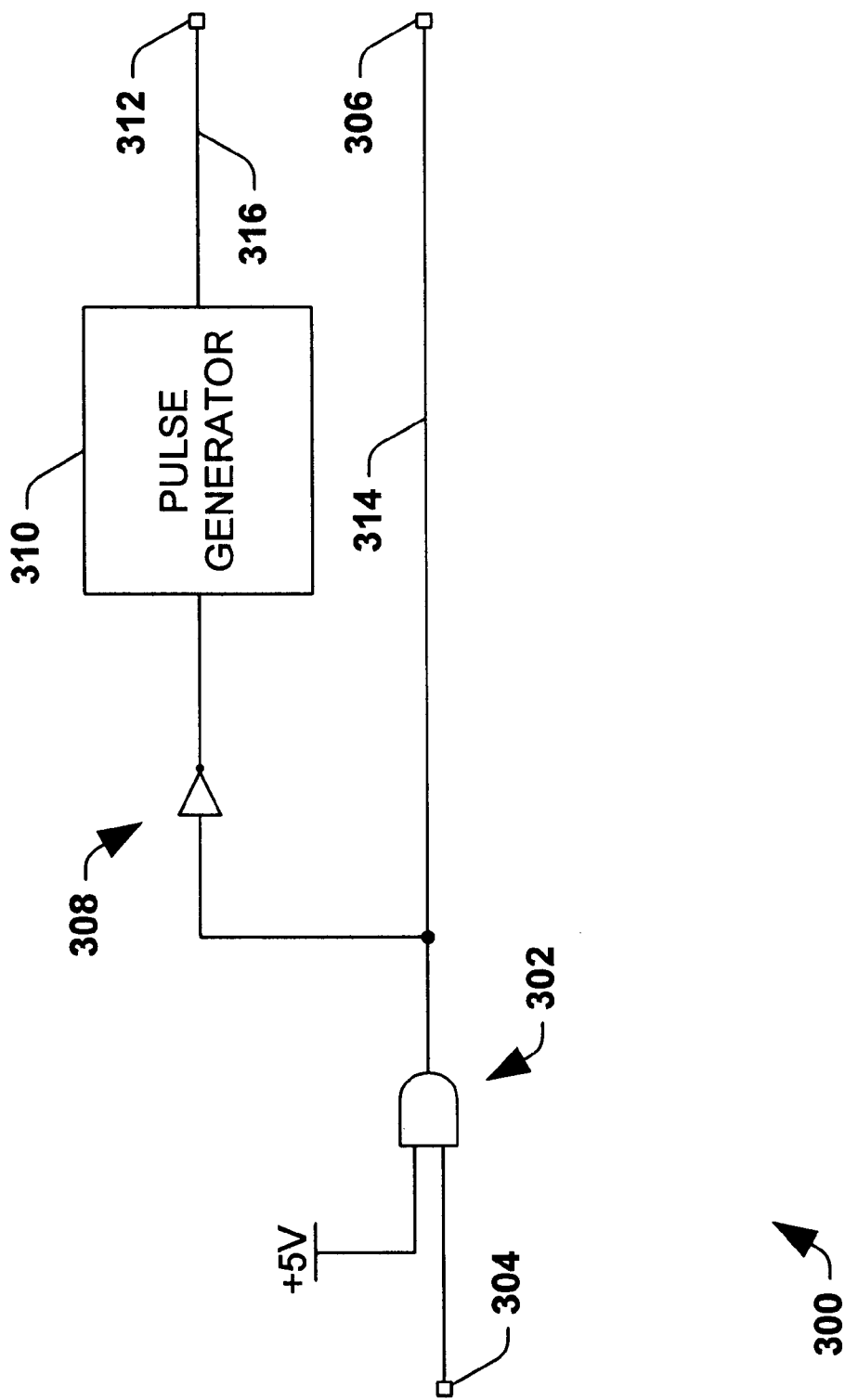
FIG. 8A is a schematic block diagram illustrating an exemplary logic circuit in accordance with another aspect of the invention.
Figure 8B:
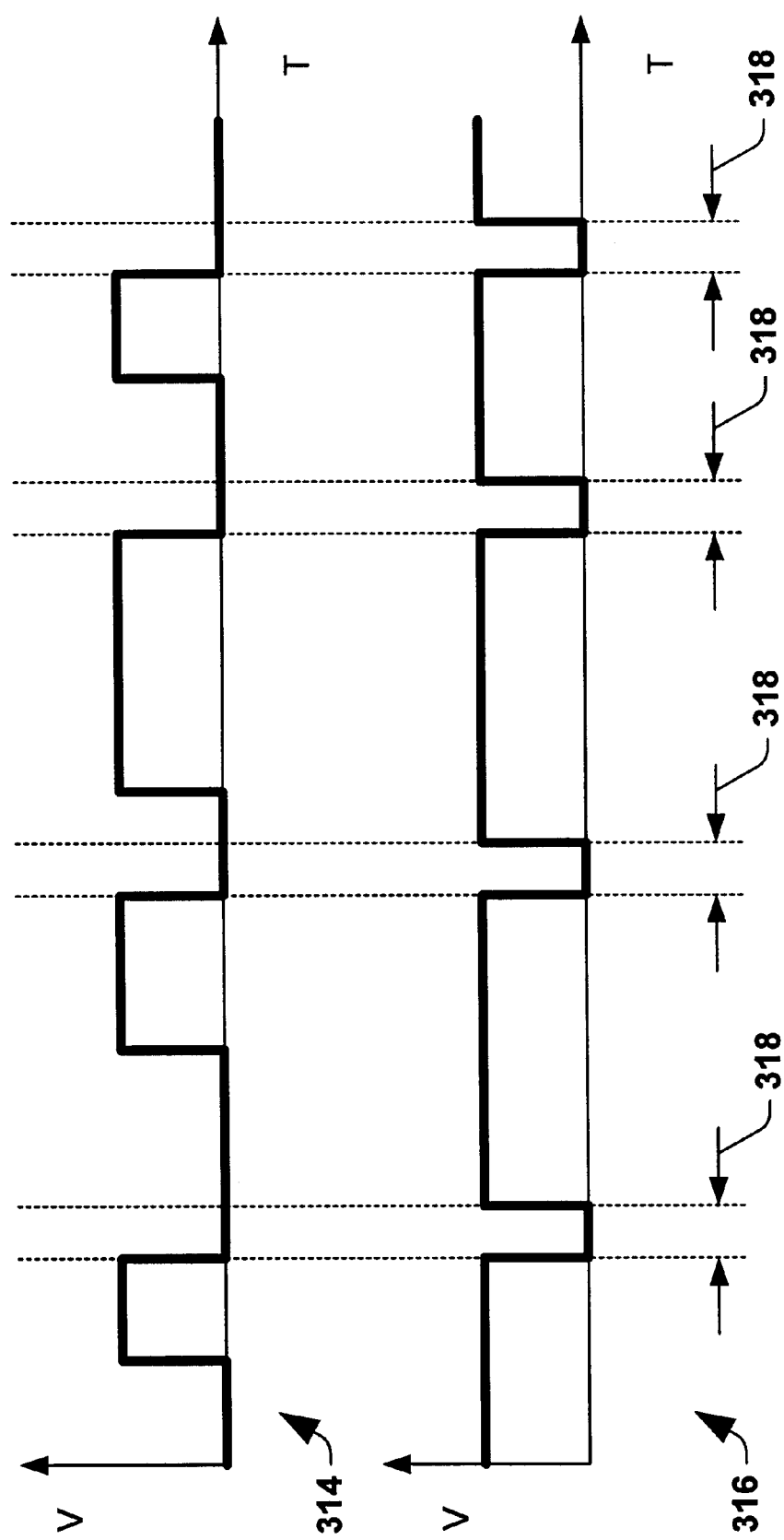
FIG. 8B is a timing diagram associated with the exemplary logic circuit of FIG. 8A.

Referring also to FIGS. 8A and 8B, a logic component 300 is illustrated having a gate 302 connected to a terminal 304, and having an output connected to a first terminal 306 and an inverter gate 308. Inverter 308 has an output connected to a pulse generator 310, which in turn has a pulse output connected to a terminal 312. According to one aspect of the invention, the output of gate 302 provides the first signal 314 to the device 230 of FIG. 7 via terminals 306 and 236 in order to turn on the output switching device Q30 using the first isolation component 232, and the output of the pulse generator 310 provides the second signal 316 to device 230 via terminals 312 and 238 in order to turn off the device Q30 using the second isolation component 234.

In FIG. 8B, exemplary first and second signals 314 and 316 are illustrated graphically. It will be appreciated that when first signal 314 is high, first isolation component 232 turns on, thus energizing the switching device Q30 of FIG. 7, and that when second signal 316 is low, second isolation component 234 turns on, thereby turning switching component Q30 off. According to an aspect of the invention, signals 314 and 316 may advantageously generated by logic component 300 such that when signal 314 goes low, signal 316 also goes low. This provides for fast turn off of switching component Q30 by reducing the voltage across the source and drain thereof instead of waiting for the discharge of this voltage according to the capacitance of Q30 and the resistance R33.

Another aspect of the invention provides that signal 316 stays low for a fixed time period 318 to ensure that the switching component Q30 is turned off completely, and then returns to the high state, as illustrated in FIG. 8B. For example, a pulse duration 318 of 22 $\mu$S has been successfully employed to obtain on-to-off switching times of less than 25$\mu$S, with on-to-off times less than 15 $\mu$S. Such a pulse signal 316 of known duration may be generated by pulse generator 310 according to a low going edge of first signal 314, as illustrated in FIG. 8A. Although the logic component 300 has been described as illustrated in FIG. 8A, it will be appreciated that many other possible logical circuit implementations are possible wherein second signal 316 turns on the second isolation component 234 for a known time period before subsequently turning component 234 off again. This aspect of the invention provides for reduced turn on time for device 230 since the first isolation component 232 can raise the voltage across the source and gate of switching component Q30 faster when the second isolation component 234 is off. Where a single signal is used to operate both first and second isolation components 232 and 234 in push-pull fashion, component 232 tries to turn on while component 234 tries to turn off. By ensuring that component 234 is already off before component 232 tries to turn on, the exemplary logic component and signal timing of FIGS. 8A and 8B provide both faster on-to-off time and off-to-on time for the output device 230 of FIG. 7 than was previously found in conventional devices and methodologies.

It will be further recognized that many different implementations of the invention may be realized, other than those illustrated and described herein, each of which falls within the scope of the invention. In particular, although the various isolation components 222, 224, 232, and 234 have been illustrated as opto-couplers, other forms of isolation components may be employed, which provide electrical isolation and fast switching capabilities. In addition, many different logic components and signals may be employed to quickly energize the switching component via a first isolation component, and to quickly de-energize the switching component via a second isolation component. Moreover, while the switching components Q20 and Q30 have been illustrated and described herein as field effect transistors (FETs), other switching components are possible and are contemplated as within the scope of the present invention.

Figure 9A:
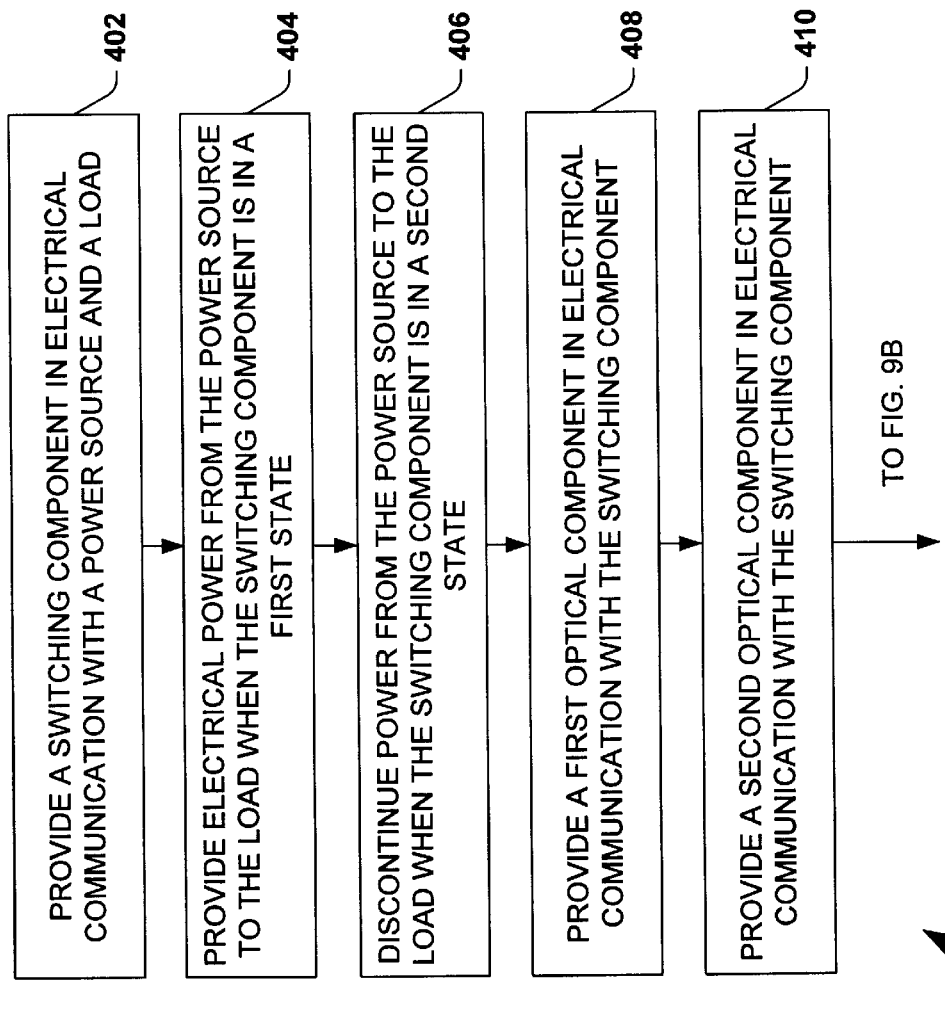
FIG. 9A is a flow diagram illustrating a method of providing power to a load in an industrial control system in accordance with another aspect of the invention.

Referring now to FIGS. 9A and 9B, an exemplary method 400 of providing power to a load in an industrial control system is illustrated in accordance with another aspect of the invention. Beginning at step 402, the method 400 comprises providing a switching component in electrical communication with a power source and a load, and having a first state and a second state. At step 404, electrical power is provided from the power source to the load when the switching component is in the first state, and at step 406, power is discontinued from the power source to the load when the switching component is in the second state.

Continuing at step 408, a first isolation component is provided in electrical communication with the switching component and adapted to selectively energize the switching component, and a second isolation component is provided at step 410 in electrical communication with the switching component and adapted to selectively de-energize the switching component. Continuing in FIG. 9B, the switching component is selectively placed in the first state by energizing the switching component using the first isolation component at step 412, and at step 414, the switching component is selectively placed in the second state by de-energizing the switching component using the second isolation component. The method 400 achieves both electrical isolation between the industrial control system power and the power source as well as reduced switching times for the control system output.

It will be further appreciated that energizing the switching component using the first isolation component may comprise providing a first signal to the first isolation component, whereby the first isolation component energizes the switching component. In addition, de-energizing the switching component using the second isolation component may comprise providing a second signal to the second isolation component, whereby the second isolation component de-energizes the switching component.

Although the invention has been shown and described with respect to a certain illustrated implementations, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (i.e., that is functionally equivalent), even though not structurally equivalent to the disclosed structure, which performs the function in the herein illustrated exemplary implementations of the invention In addition, while a particular feature of the invention may have been disclosed with respect to only one of several illustrated implementations, such feature may be combined with one or more other features of the other embodiments as may be desired and advantageous for any given or particular application. Furthermore, to the extent that the terms "includes", "including", "has", "having", and variants thereof are used in either the detailed description or the claims, these terms are intended to be inclusive in a manner similar to the term "comprising."

What is claimed is:

1. An industrial control device comprising:
    a switching component deriving a threshold switching voltage from a power source and operative to be energized on and de-energized off to selectively provide electrical power from the power source to a load;
    a logic component that generates a first signal and a second signal independent of the first signal and operative to be non-complementary with respect to the first signal, further comprising a pulse generator that generates a low pulse of the second signal for a fixed duration causing the switching component to de-energized by actively removing voltage;
    a first optical component in electrical communication with the switching component and adapted to selectively energize the switching component in response to the first signal, the first optical component comprising a first opto-coupler, the first opto-coupler comprising a first transistor, the first optical component operative to electrically isolate the logic component; and
    a second optical component in electrical communication with the switching component and adapted to selectively de-energize the switching component in response to the second signal, the second optical component comprising a second opto-coupler, the second opto-coupler comprising a second transistor, the second optical component operative to electrically isolate the logic component.

2. The industrial control device of claim 1, wherein the switching component comprises a FET having a gate in electrical communication with the first and second optical components, a source in electrical communication with the power source, and a drain in electrical communication with the load;

wherein the first optical component is adapted to selectively provide a voltage between the gate and the source of the FET in response to the first signal; and wherein the second optical component is adapted to selectively remove the voltage between the gate and the source of the FET in response to the second signal.

3. The output device of claim 1, wherein the logic component causes the second signal to be low for a fixed time period prior to causing the first signal to be high, whereby the second isolation component stops de-energizing the switching component prior to the first isolation component energizing the switching component and facilitates fast switching of the switching component.

4. The industrial control device of claim 1, the switching component operative to have on-to-off switching times of less than 15 $\mu$S and off-to-on switching times of less than 25 $\mu$S.

5. The industrial control device of claim 1, wherein the low pulse of the second signal is generated while the first signal is high.

6. The industrial control device of claim 1, wherein the low pulse of the second signal is generated while the first signal is low.

7. The industrial control device of claim 1, wherein the fixed duration is about 22 $\mu$S and provides an on-to-off switching time of less than about 15 $\mu$S.

8. The industrial control device of claim 1, wherein the second isolation component is off and the first signal is high prior to the first isolation component being turned on.

9. The industrial control device of claim 1, the logic component operative to cause the switching component to selectively provide the electrical power according to a control program.

10. The industrial control device of claim 1, the load being a motor.

11. The industrial control device of claim 1, the load being an actuator.

12. The industrial control device of claim 1, the load being a valve.

13. A method of providing power to a load in an industrial control system, comprising:

providing a switching component in electrical communication with a power source and a load, and having a first state and a second state;

providing electrical power from the power source to the load when the switching component is in the first state;

discontinuing power from the power source to the load when the switching component is in the second state;

providing a first isolation component comprising a first opto-coupler having a first transistor in electrical communication with the switching component and adapted to selectively energize the switching component;

providing a second isolation component comprising a second opto-coupler having a second transistor in electrical communication with the switching component and adapted to selectively de-energize the switching component;

selectively placing the switching component in the first state by energizing the switching component using the first isolation component, wherein energizing the switching component comprises providing a first signal to the first isolation component; and selectively placing the switching component in the second state, independent of the first state by de-energizing the switching component using the second isolation component, wherein de-energizing the second isolation component comprises asserting a second signal via a pulse for a fixed duration, whereby the second isolation component actively removes voltage from the switching component.

14. A method of providing power to a load comprising:

turning a first optical transistor on in response to a first signal being asserted high;

deriving a threshold voltage from a power source to facilitate energizing a switching component in response to the first optical transistor being on;

providing power from the power source to a load via the switching component;

turning a second optical transistor on in response to a second signal being asserted low via a pulse of a fixed duration;

de-energizing the switch component in response to the second optical transistor being on by actively removing the voltage on the switching component; and isolating the load from the power as a result of the switching component being de-energized.

15. The method of claim 14, wherein the switching component remaining de-energized after the pulse has occurred.

16. The method of claim 14, wherein the second optical transistor is turned off for a fixed duration prior to the first optical transistor being turned on.

* * * * *